US011175582B2

(12) United States Patent
Malik et al.

(10) Patent No.: US 11,175,582 B2
(45) Date of Patent: Nov. 16, 2021

(54) PHOTOSENSITIVE STACKED STRUCTURE (71) Applicant: Fujifilm Electronic Materials U.S.A., Inc., N. Kingstown, RI (US)

(72) Inventors: Sanjay Malik, Attleboro, MA (US); Raj Sakamuri, Sharon, MA (US); Ognian N. Dimov, Warwick, RI (US); Binod B. De, Attleboro, MA (US); William A. Reinerth, Riverside, RI (US); Ahmad A. Naiini, East Greenwich, RI (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 364 days.

(21) Appl. No.: 16/065,873

(22) PCT Filed: Dec. 20, 2016

(86) PCT No.: PCT/US2016/067822
§ 371 (c)(1),
(2) Date: Jun. 25, 2018

(87) PCT Pub. No.: WO2017/116858
PCT Pub. Date: Jul. 6, 2017

(65) Prior Publication Data
US 2019/0018321 A1    Jan. 17, 2019

Related U.S. Application Data (60) Provisional application No. 62/273,106, filed on Dec. 30, 2015.

(51) Int. Cl.
| | | |
|---|---|---|
| *G03F 7/095* | (2006.01) | |
| *C09D 179/08* | (2006.01) | |
| *G03F 7/033* | (2006.01) | |
| *G03F 7/037* | (2006.01) | |
| *G03F 7/075* | (2006.01) | |
| *G03F 7/32* | (2006.01) | |
| *C09D 133/10* | (2006.01) | |
| *C08G 73/10* | (2006.01) | |
| *H01L 21/311* | (2006.01) | |
| *G03F 7/027* | (2006.01) | |

(52) U.S. Cl.
CPC ......... *G03F 7/095* (2013.01); *C08G 73/1014* (2013.01); *C08G 73/1039* (2013.01); *C08G 73/1067* (2013.01); *C09D 133/10* (2013.01); *C09D 179/08* (2013.01); *G03F 7/027* (2013.01); *G03F 7/033* (2013.01); *G03F 7/037* (2013.01); *G03F 7/0755* (2013.01); *G03F 7/325* (2013.01); *H01L 21/311* (2013.01)

(58) Field of Classification Search
CPC ..................................................... G03F 7/095
See application file for complete search history.

(56) References Cited

U.S. PATENT DOCUMENTS

| | | | |
|---|---|---|---|
| 3,934,057 A | 1/1976 | Moreau et al. | |
| 4,582,778 A | 4/1986 | Sullivan | |
| 4,808,682 A | 2/1989 | Schwalm et al. | |
| 4,904,564 A | 2/1990 | Chiong | |
| 5,114,826 A | 5/1992 | Kwong et al. | |
| 5,503,961 A * | 4/1996 | Linde ............... | G03F 7/0035 430/315 |
| 7,476,476 B2 | 1/2009 | Suwa | |
| 2003/0211729 A1 | 11/2003 | Lee et al. | |
| 2004/0094752 A1* | 5/2004 | Ito ..................... | G03F 7/022 252/578 |
| 2004/0265746 A1 | 12/2004 | Yates | |
| 2010/0218984 A1 | 9/2010 | Yamanaka et al. | |
| 2014/0113223 A1 | 4/2014 | Kato et al. | |
| 2017/0261854 A1 | 9/2017 | Yamazaki et al. | |

FOREIGN PATENT DOCUMENTS

| | | | | |
|---|---|---|---|---|
| JP | S 61-055922 A | 3/1986 | ............ | H01L 21/30 |
| JP | H 01-112730 A | 5/1989 | ............ | H01L 21/30 |
| JP | H 02-039049 A | 2/1990 | ............ | G03F 7/095 |
| JP | H 02-063056 A | 3/1990 | ............ | G03F 7/095 |
| JP | 2001-019564 A | 1/2001 | ............ | C04B 35/65 |
| JP | 2003-338458 A | 11/2003 | ......... | H01L 21/027 |
| JP | 2006-267296 A | 10/2006 | ............. | G03F 7/11 |
| JP | 2008-158007 A | 7/2008 | ............ | G03F 7/095 |
| JP | 2012-091430 A | 5/2012 | ............ | B32B 27/34 |
| JP | 2013-033227 A | 2/2013 | ............ | G03F 7/095 |
| TW | 200502320 | 1/2005 | ............ | C08G 73/10 |
| TW | 200728908 | 8/2007 | ............ | G03F 7/004 |
| TW | 201303507 | 1/2013 | ............ | G03F 7/038 |
| TW | 201546824 | 12/2015 | .............. | H01B 1/12 |
| WO | WO 2007/086385 | 8/2007 | ............ | G03F 7/095 |

(Continued)

OTHER PUBLICATIONS

International Search Report for PCT/US2016/067822, dated May 5, 2017. 3 pages.
Supplementary European Search Report for European Application No. EP 16 88 2377 dated Jul. 31, 2019.
Official Letter from the Taiwan Patent Office and Search Report for Taiwan Application No. TW 105143187, dated Aug. 13, 2020 (with English translation).
Japanese Office Action for Japanese Application No. JP 2018-534789 dated Jan. 5, 2021 (With English Translation).
Office Action and Search Report for Taiwan Application No. TW 105143187, dated Jan. 21, 2021 (with English Summary).

*Primary Examiner* — Kathleen Duda (74) *Attorney, Agent, or Firm* — Fish & Richardson P.C.

(57) ABSTRACT

This disclosure relates to a photosensitive stacked structure that includes first and second layers, in which the first layer is a photosensitive, dielectric layer and the second layer is a photosensitive layer. The dissolution rate of the first layer in a developer is less than the dissolution rate of the second layer in the developer.

24 Claims, 1 Drawing Sheet

(56) References Cited

FOREIGN PATENT DOCUMENTS

| WO | 201406909 A1 | 5/2014 | | |
| WO | WO 2014/175260 | 10/2014 | ............... | H05K 3/28 |

* cited by examiner

PHOTOSENSITIVE STACKED STRUCTURE

CROSS-REFERENCE TO RELATED APPLICATIONS

The present application is a U.S. National phase Application Under 35 U.S.C. § 371 of International Application No. PCT/US2016/067822, filed on Dec. 20, 2016 which claims the benefit of U.S. Provisional Application Ser. No. 62/273,106, filed on Dec. 30, 2015. The contents of the parent applications are incorporated herein by references in their entireties.

BACKGROUND OF THE DISCLOSURE

The continued expansion of mobile computing applications requires the packing of ever growing levels of computing power in smaller device footprints. Designers of semiconductor devices are relying on the use of a variety of new chip architectures to meet the new device requirements. These new architectures include flip chip wafer bumping using copper pillars as well as approaches employing through silicon vias (TSV) such as three-dimensional integrated circuits (3D IC) in which wafers are thinned, the resulting dies are stacked and then connected by TSV and 2.5D interposer designs. These approaches pose significant challenges not only for the designers of these new IC architectures, but for the designers of the packaging materials that will be used for these devices.

Material requirements for packaging applications are continuously evolving as these new, advanced devices are relying heavily on wafer level packaging (WLP) and 3D integration. While there are a number of traditional packaging materials that have been employed through the years, polyimides, due to their excellent electrical, mechanical and thermal properties, have been the material of choice for semiconductor packaging applications. However, drawbacks of conventional polyimides include high cure temperatures (>350° C.), high post-cure shrinkage and high levels of moisture absorption. This high shrinkage leads to cured polyimide films having high residual stress which leads to bowing of the silicon wafer. The next generation chip architectures employing 3D integration require that the silicon wafers be thinned down up to 20 µm in most advanced applications in order to satisfy requirements for vertical integration. These thinned wafers are extremely fragile and excessive residual stress in the packaging material used could be catastrophic. The next generation packaging materials should be designed so as to impart minimal stress on the wafer. For this reason, low cure temperature and low post-cure shrinkage are among the important requirements for advanced packaging materials.

Photoimageable dielectric materials used in semiconductor packaging processes enable the generation of relief structures through pattern-wise exposure and development. Unlike other lithographic processes, in packaging applications a wall angle of <90° (i.e. "sloped") is preferred due to subsequent processing steps such as metal deposition (electroplating, sputtering, etc.). For traditional dielectric materials this sloped profile can be achieved by curing the dielectric at a temperature above the material's $T_g$ (also known as thermal reflow). Thermal reflow transforms a vertical sidewall (wall angle≈90°) to a sloped sidewall. This approach can be implemented with conventional dielectric materials because the material's glass transition temperature is lower than its curing temperature. Advanced packaging applications require high $T_g$ materials and low curing temperatures which preclude the possibility of using thermal reflow to achieve the desired sidewall angle. This disclosure describes a method for forming a sloped profile in a high $T_g$ photoimageable dielectric coating by use of a bilayer approach.

BRIEF SUMMARY OF THE DISCLOSURE

In some embodiments, this disclosure features a photosensitive stacked structure that includes:
  a first layer, the first layer being a photosensitive dielectric layer; and
  a second layer, the second layer being a photosensitive layer;
in which the dissolution rate of the first layer in a developer is less than the dissolution rate of the second layer in the same developer.

In some embodiments. the second layer includes: (a) at least one polymer; (b) at least one solubility switching compound (SSC), and (c) at least one photoactive compound selected from the group consisting of a photoacid generator (PAG), a photosensitive radical initiator and a photosensitizer/initiator combination.

In some embodiments, the second layer is formed from a photosensitive composition comprising: (a) at least one polymer; (b) at least one solubility switching compound (SSC), (c) at least one photoactive compound selected from the group consisting of a photoacid generator (PAG), a photosensitive radical initiator and a photosensitizer/initiator combination and (d) at least one solvent.

In some embodiments, the at least one polymer in the first or second layer includes a reactive group, such as those that can react with the SSC to reduce the solubility of the film in the developer after exposure to an actinic radiation.

In some embodiments, the reactive group possessed by the at least one polymer in the first or second layer is selected from the group consisting of hydroxyl, thiol, amino, and carboxyl groups.

In some embodiments, the at least one polymer in the second layer is formed from at least one monomer selected from the group consisting of (meth)acrylates, urethanes, amides, imide, esters, ethers, ethylenically unsaturated hydrocarbons and a combination thereof.

In some embodiments, the at least one polymer in the first or second layer does not possess a reactive group. In some embodiments, the at least one photoactive compound in the first or second layer includes at least one photoinitiator or a photosensitizer/initiator combination.

In some embodiments, the first layer is formed from a photosensitive composition that includes: (a) at least one polyimide polymer (e.g., at least one fully imidized polyimide polymer); (b) at least one solubility switching compound (SSC), (c) at least one photoactive compound selected from the group consisting of a photosensitive radical initiator and a photosensitizer/initiator combination and (d) at least one solvent.

In some embodiments, the disclosure features a process for preparing a photosensitive stacked structure described herein. The process can include:
  (a) coating a substrate with a composition that forms the first layer to form a first coated substrate;
  (b) baking the first coated substrate in a first baking step to form the first layer;
  (c) coating the first layer with a composition that forms the second layer to form a second coated substrate; and
  (d) baking the second coated substrate in a second baking step to form the second layer on top of the first layer.

In some embodiments, the disclosure features a process for preparing a sloped relief image. The process can include:
(a) exposing the photosensitive stacked structure to an actinic radiation through a mask to form a pattern-wise exposed stacked structure;
(b) optionally, baking, in a third baking step, the pattern-wise exposed photosensitive stacked structure;
(c) developing at least a portion of the pattern-wise exposed photosensitive stacked structure with a developer to produce a sloped relief image on the stacked structure;
(d) optionally, rinsing the relief image with a solvent or a mixture of solvents; and
(e) optionally, baking the stacked structure having a slope relief image in a fourth baking step. In some embodiments, the fourth baking step can be performed at a temperature lower than the glass transition temperature of the first layer.

In some embodiments, the disclosure features a dry film structure that includes:
a carrier layer;
a first layer, the first layer being a photosensitive dielectric layer;
a second layer, the second layer being a photosensitive layer and disposed between the carrier layer and the first layer; and
optionally, a protective layer, the first layer disposed between the second layer and the optional protective layer;
in which the ratio of the dissolution rate of the first layer to the dissolution rate of the second layer in the same developer (e.g., cyclopentanone) is less than 1.

In some embodiments, the disclosure features a method for preparation of the dry film structure described above. The method includes:
(a) coating a carrier layer with a composition to form the second layer;
(b) drying the second layer;
(c) coating the second layer with a composition to form the first layer;
(d) drying the first layer and;
(e) optionally, applying a protective layer to the first layer to form the dry film structure.

In some embodiments, the disclosure features a process for preparing a photosensitive stacked structure described herein. The process can include, for example:
(a) removing the optional protective layer from the dry film structure described above; and
(b) applying the structure obtained in step (a) onto an electronic substrate to form a laminate.

In some embodiments, the disclosure features a process for preparing a photosensitive stacked structure described herein. The process can include:
(a) coating a substrate with a composition that forms the first layer to form a first coated substrate;
(b) baking the first coated substrate in a first baking step to form the first layer;
(c) laminating the first layer with a dry film structure comprising a carrier layer and the second layer to form a second coated substrate, in which the second layer is between the first layer and the carrier layer; and
(d) removing the carrier layer after laminating the first layer.

In some embodiments, the disclosure features a process for preparing a photosensitive stacked structure described herein. The process can include:
(a) laminating a substrate with a dry film structure comprising a carrier layer and a polymeric layer to form a first coated substrate, in which the polymeric layer forms the first layer and the first layer is disposed between the substrate and the carrier layer;
(b) removing the carrier layer after the laminating step;
(c) coating the first layer with a composition that forms the second layer to form a second coated substrate; and
(d) baking the second coated substrate in a baking step to form the second layer such that the first layer is disposed between the second layer and the substrate.

In some embodiments, the disclosure features a process for preparing a photosensitive stacked structure described herein. The process can include:
(a) laminating a substrate with a dry film structure comprising a carrier layer and first layer to form a first coated substrate, in which the first layer is disposed between the substrate and the first carrier layer;
(b) removing the first carrier layer after laminating step;
(c) laminating the first layer with a dry film structure comprising a second carrier layer and the second layer to form a second coated substrate, in which the second layer is disposed between the first layer and the second carrier layer; and
(d) removing the second carrier layer after laminating the first layer.

DETAILED DESCRIPTION OF THE DISCLOSURE

Figure 1:
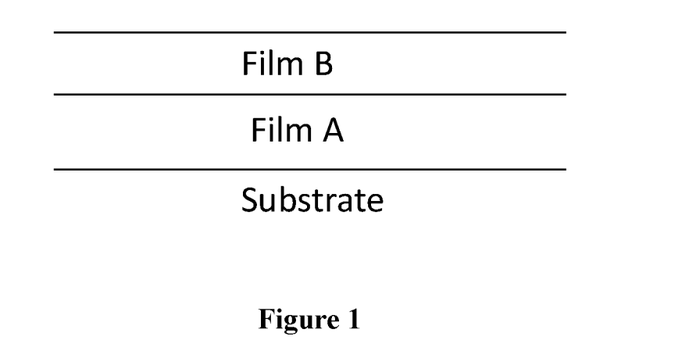
FIG. 1 illustrates an exemplary photosensitive stacked structure described in this disclosure.

In some embodiments, this disclosure features a photosensitive stacked structure (e.g., a bilayer structure). The photosensitive stacked structure can include a first layer (e.g., a first polymeric layer) and a second layer (e.g., a second polymeric layer). The first layer can be a photosensitive, dielectric layer; and the second layer can be a photosensitive layer. The dissolution rate of the first layer in a developer (e.g., cyclopentanone) can be less than the dissolution rate of the second layer in the same developer (e.g., cyclopentanone). In some embodiments, the photosensitive stacked structure can further include an electronic substrate on which the first and the second layers are disposed. An exemplary photosensitive stacked structure is shown in FIG. 1. In some embodiments, film A in FIG. 1 can be the first layer and film B in FIG. 1 can be the second layer. In some embodiments (e.g., when the photosensitive stacked structure is a dry film), film A in FIG. 1 can be the second layer and film B in FIG. 1 can be the first layer. As used herein, the term "film" is used interchangeably with the term "layer."

In some embodiments, the electronic substrate in the photosensitive stacked structure is a silicon substrate, a copper substrate, an aluminum substrate, a titanium substrate, a substrate having a copper seed layer, a silicon oxide substrate, a silicon nitride substrate, a titanium nitrite substrate, a glass substrate, an organic laminate substrate, or a dielectric material substrate. In some embodiments, the electronic substrate can be a wafer (e.g., a silicon wafer or a copper wafer) made from the materials described above.

In some embodiments, the second layer can include: (a) at least one polymer; (b) at least one solubility switching compound (SSC), and (c) at least one photoactive compound selected from the group consisting of a photoacid generator (PAG), a photosensitive radical initiator and a photosensitizer/initiator combination.

In general, the dissolution rate in a developer (e.g., cyclopentanone) of the first layer can be defined as (S1) and the dissolution rate in the same developer (e.g., cyclopentanone) of the second layer can be defined as (S2). In some embodiments, the ratio of (S1) to (S2) can be less than 1. For example, the ratio of (S1) to (S2) can be less than about 0.9 (e.g., less than about 0.85, less than about 0.80, less than about 0.75, less than about 0.70, less than about 0.65 or less than about 0.60) and higher than about 0.05 (e.g., higher than about 0.1, higher than about 0.15, higher than about 0.2, higher than about 0.25, higher than about 0.3, or higher than about 0.35). Without wishing to be bound by theory, it is believed that, when the ratio of (S1) to (S2) is less than 1, the photosensitive stacked structure described herein can readily form a sloped image profile after exposed to a suitable actinic radiation and developed by using a developer (e.g., cyclopentanone). For example, when an exemplary photosensitive stacked structure shown in FIG. 1 includes film A as the first layer and film B as the second layer, the second layer would have a higher dissolution rate than the first layer in a developer when the ratio of (S1) to (S2) is less than 1. As such, after the photosensitive stacked structure is exposed to a suitable actinic radiation and developed by a developer, the second layer would be dissolved by the developer by a larger degree than the first layer, thereby resulting in a sloped relief image.

In general, the first layer should not intermix with the second layer. In some embodiments, the first layer does not have appreciable solubility in the casting solvent used to form the second layer. For example, the first layer has a solubility of less than about 1% at a temperature of about 25° C. in the casting solvent used to form the film of the second layer. In some embodiments, the second layer does not have appreciable solubility in the casting solvent used to form the first layer. For example, the second layer has a solubility of less than about 1% at a temperature of about 25° C. in the casting solvent used to form the film of the first layer. In some embodiments, the first and second layers remain essentially immiscible.

In some embodiments, the second layer is formed from a photosensitive composition (e.g., a negative tone photosensitive composition) that includes: (a) at least one polymer; (b) at least one solubility switching compound (SSC), (c) at least one photoactive compound selected from the group consisting of a photoacid generator (PAG), a photosensitive radical initiator and a photosensitizer/initiator combination and (d) at least one solvent.

In some embodiments, the at least one polymer that can be used to prepare the second layer is at least one (meth)acrylate polymer. As used herein, the term "(meth)acrylate" include both acrylate and methacrylate compounds. Examples of suitable (meth)acrylate polymers include, but are not limited to, poly(benzyl methacrylate), poly(butyl methacrylate), poly(tert-butyl methacrylate), poly(butyl methacrylate-co-isobutyl methacrylate), poly(butyl methacrylate-co-methyl methacrylate), poly(cyclohexyl methacrylate), poly(2-ethylhexyl methacrylate), poly(ethyl methacrylate), poly(hexadecyl methacrylate), poly(hexyl methacrylate), poly(isobutyl methacrylate), poly(isopropyl methacrylate), poly(lauryl methacrylate-co-ethylene glycol dimethacrylate), poly(methyl methacrylate), poly(methyl methacrylate-co-ethyl acrylate), poly(methyl methacrylate-co-ethylene glycol dimethacrylate), poly(octadecyl methacrylate), poly(tetrahydrofurfuryl methacrylate), poly(tetrahydrofurfuryl methacrylate-co-ethyl methacrylate), poly(butyl acrylate), poly(ethyl acrylate), poly(2-ethylhexyl acrylate), and poly(methyl acrylate).

In some embodiments, the at least one polymer that can be used to prepare the second layer is a polymer containing at least one (meth)acrylate, urethane, amide, imide, ester, ether, and/or hydrocarbon moiety. In some embodiments, the at least one polymer that can be used to prepare the second layer is a polymer made from monomers selected from the group consisting of (meth)acrylates, urethanes, amides, imides, esters, ethers, ethylenically unsaturated hydrocarbons and a combination thereof.

Examples of polymers containing at least one ether moiety include, but are not limited to, polyethylene glycol (PEG), polypropylene glycol (PPG), poly(methyl vinyl ether), poly(methyl vinyl ether-alt-maleic anhydride) and polytetramethylene glycol (PTMG).

Examples of polymers made from monomers containing ethylenically unsaturated hydrocarbons include, but are not limited to, polyolefins (e.g., polyethylenes, polypropylenes, and polystyrenes) and polycycloolefins (e.g., polynorbornenes).

In some embodiments, the at least one polymer that can be used to prepare the second layer is a novolac polymer.

In some embodiments, the at least one polymer that can be used to prepare the second layer possesses a reactive group which can react with the SSC to reduce the solubility of the second layer in a developer (e.g., cyclopentanone) after exposure to an actinic radiation.

In some embodiments, the at least one polymer that can be used to prepare the second layer contains a reactive group such as a hydroxyl group (—OH), a thiol group (—SH), an amino group (—NH$_2$), or a carboxyl group (—COOH). An example of such a polymer with hydroxyl reactive groups is poly(isobornyl methacrylate-co-hydroxyethyl methacrylate). In some embodiments, when the reactive group is hydroxyl, the second layer can include a photoacid generator (PAG) and a compound having two or more hydroxyl groups as the SSC.

In some embodiments, the amount of the at least one polymer can be at least about 5 weight % (e.g., at least about 10 weight %, at least about 15 weight %, at least about 20 weight %, or at least about 25 weight %) and/or at most about 50 weight % (e.g., at most about 45 weight %, at most about 40 weight %, at most about 35 weight %, or at most about 30 weight %) of the entire weight of the photosensitive composition for the second layer.

The solubility switching compound (SSC) generally helps to generate a contrast in the dissolution rate of both the first layer and the second layer (e.g., before and after exposure to actinic radiation). In some embodiments, the SSC can be a cross-linking agent, which can cross-link the polymers in the first or the second layers after exposure to actinic radiation, thereby reducing the solubilities of these polymers in a developer. In some embodiments, the SSC possesses at least one (e.g., at least two, at least three or at least four) functional group capable of reacting with other SSC compounds or with a functional group on a polymer in the first or second layer. The SSC can be a monomer or an oligomer. The oligomer can contain two or more monomer units. Examples of such monomer units/oligomers are based on one or more of the following types: (meth)acrylates, esters, vinyl compounds (e.g., vinyl alcohol), urethanes, ureas, imides, amides, carboxazoles, carbonates, pyranoses, siloxanes, urea-formaldehydes and melamine-formaldehydes. In some embodiments, the SSC contains at least one terminal and/or pendant reactive functional group capable of radical or thermal reaction with a functional group on another SSC compound or with a functional group on a polymer in the first or the second layer. In one embodiment, the reactive functional group on the SSC includes a double or triple bond.

Suitable examples of reactive functional groups on the SSC include, but are not limited to, vinyl, allyl, vinyl ether, propenyl ether, (meth)acryloyl, —SiH and —SH.

In one embodiment, a suitable example of an SSC includes, but is not limited to, an urethane acrylate oligomer. The term "urethane acrylate oligomer" refers to a class of compounds that contain urethane linkages and have (meth) acrylate (e.g., acrylate or methacrylate) functional groups such as urethane multi(meth)acrylates, multiurethane (meth)acrylates, and multiurethane multi(meth)acrylates. Types of urethane (meth)acrylate oligomers have been described by, for example, Coady et al., U.S. Pat. No. 4,608,409 and by Chisholm et al., U.S. Pat. No. 6,844,950. Other specific examples of SSC include, but are not limited to, 1,6-hexanediol di(meth)acrylate, tetraethyleneglycol di(meth)acrylate, divinylbenzene, ethoxylated bisphenol-A-di(meth)acrylate, diethylene glycol bis(allyl carbonate), trimethylolpropane tri(meth)acrylate, ditrimethylolpropane tetra(meth)acrylate, pentaerythritol tri(meth)acrylate, pentaerythritol tetra(meth)acrylate, dipentaerythritol penta-/hexa-(meth)acrylate, isocyanurate tri(meth)acrylate, bis(2-hydroxyethyl)-isocyanurate di(meth)acrylate, 1,3-butanediol di(meth)acrylate, 1,4-butanediol di(meth) acrylate, methyl (meth)acrylate, butyl (meth)acrylate, cyclohexyl (meth)acrylate, benzyl(meth)acrylate, neopentyl glycol di(meth)acrylate, (meth)acrylate modified-urea-formaldehyde resins, (meth)acrylate modified melamine-formaldehyde resins and (meth)acrylate modified cellulose.

Examples of SSC compounds containing SH groups include, but are not limited to, trimethylolpropane tris(2-mercaptoacetate), pentaerythritol tetrakis(2-mercaptoacetate), dipentaerythritol hexakis(3-mercaptopropionate), and ethoxylated trimethylolpropane tri-3-mercaptopropionate. Examples of SSC compounds containing vinyl ether groups include, but are not limited to, 1,4-butanediol divinyl ether, 1,4-cyclohexanedimethanol divinyl ether, di(ethylene glycol) divinyl ether, poly(ethylene glycol) divinyl ether, and bis[4-(vinyloxy)butyl](4-methyl-1,3-phenylene)biscarbamate. One example of a SSC compound containing a SiH group is octasilane POSS® SH1310 available from Hybrid Plastics.

Examples of solubility switching compounds (SSC) with at least two hydroxyl groups include, but are not limited to, ethylene glycol, diethylene glycol, polyethylene glycol, propylene glycol, dipropylene glycol, tripropylene glycol, polypropylene glycol, glycerol, butane diol, pentane diol, hexane diol, sorbitol, 1,4-cyclohexanediol, 4,8-bis(hydroxymethyl)-tricyclo(5.2.1.0/2,6)decane, a 2-oxepanone co-polymer with 2-ethyl-2-(hydroxymethyl)-1,3-propanediol, 1,1,1-tris(4-hydroxyphenyl)ethane, anthrarobin, 2,7-dihydroxynaphthalene, 4,4-biphenol, 3-methoxycatechol, poly(hydroxystyrene), novolacs, and calixarenes.

In some embodiments, the amount of component (b) (SSC) can be at least about 1 weight % (e.g., at least about 2 weight %, at least about 3 weight %, at least about 4 weight %, or at least about 5 weight %) and/or at most about 25 weight % (e.g., at most about 20 weight %, at most about 15 weight %, or at most about 10 weight %) of the entire weight of the photosensitive composition for the second layer.

The photoactive compound present in the second layer can be selected from the group consisting of a photoacid generator, a photosensitive radical initiator and a photosensitizer/initiator combination. Specific examples of initiators that generate free radicals when exposed to high energy radiation (also known as photosensitive radical initiators or photoinitiators) include, but are not limited to, NCI-831 (Available from ADEKA Corp.), 1,8-octanedione, 1,8-bis[9-(2-ethylhexyl)-6-nitro-9H-carbazol-3-yl]-1,8-bis(O-acetyloxime), 2-hydroxy-2-methyl-1-phenylpropan-1-one, 1-hydroxycyclohexyl phenyl ketone (Irgacure 184 from BASF), a blend of 1-hydroxycyclohexylphenylketone and benzophenone (Irgacure 500 from BASF), 2,4,4-trimethylpentyl phosphine oxide (Irgacure 1800, 1850, and 1700 from BASF), 2,2-dimethoxyl-2-acetophenone (Irgacure 651 from BASF), bis(2,4,6-trimethyl benzoyl)phenyl phosphine oxide (Irgacure 819 from BASF), 2-methyl-1-[4-(methylthio)phenyl]-2-morphorinopropane-1-on (Irgacure 907 from BASF), (2,4,6-trimethylbenzoyl)diphenyl phosphine oxide (Lucerin TPO from BASF), ethoxy(2,4,6-trimethylbenzoyl)phenyl phosphine oxide (Lucerin TPO-L from BASF), a blend of phosphine oxide, hydroxy ketone and a benzophenone derivative (ESACURE KTO46 from Sartomer), 2-hydroxy-2-methyl-1-phenylpropane-1-on (Darocur 1173 from Merck), benzophenone, 2-chlorothioxanthone, 2-methylthioxanthone, 2-isopropylthioxanthone, benzodimethyl ketal, 1,1,1-trichloroacetophenone, diethoxyacetophenone, m-chloroacetophenone, propiophenone, anthraquinone, dibenzosuberone and the like.

Specific examples of nonionic-type photoinitiators include, but are not limited to, (5-toluylsulfonyloxyimino-5H-thiophen-2-ylidene)-2-methylphenyl-acetonitrile (Irgacure 121 from BASF), phenacyl p-methylbenzenesulfonate, benzoin p-toluenesulfonate, (p-toluene-sulfonyloxy)methylbenzoin, 3-(p-toluenesulfonyloxy)-2-hydroxy-2-phenyl-1-phenylpropyl ether, N-(p-dodecylbenzenesulfonyloxy)-1,8-naphthalimide, N-(phenyl-sulfonyloxy)-1,8-napthalimide, bis(cyclohexylsulfonyl)diazomethane, 1-p-toluenesulfonyl-1-cyclohexylcarbonyl-diazomethane, 2-nitrobenzyl p-toluenesulfonate, 2,6-dinitrobenzyl p-toluenesulfonate, and 2,4-dinitrobenzyl p-trifluoromethylbenzenesulfonate and the like.

Alternatively, a combination of a photosensitizer and an initiator (e.g., an initiator not activated by actinic radiation) may be used in the photosensitive composition. In this alternative, a photosensitizer can absorb the light and transfer energy to the initiator to start reactions with the SSC. Examples of photosensitizers include, but are not limited to, 9-methylanthracene, anthracenemethanol, acenaththalene, thioxanthone, methyl-2-naphthyl ketone, 4-acetylbiphenyl, and 1,2-benzofluorene.

Specific examples of initiators that can be activated by a sensitizer include, but are not limited to, benzoyl peroxide, cyclohexanone peroxide, lauroyl peroxide, tert-amyl peroxybenzoate, tert-butyl hydroperoxide, dicumyl peroxide, cumene hydroperoxide, succinic acid peroxide, di(n-propyl) peroxydicarbonate, 2,2-azobis(isobutyronitrile), 2,2-azobis (2,4-dimethylvaleronitrile), dimethyl-2,2-azobisisobutyrate, 4,4-azobis(4-cyanopentanoic acid), azobiscyclohexanecarbonitrile, 2,2-azobis(2-methylbutyronitrile) and the like.

The classes of PAGs that can be included in the second layer include, but are not limited to, oxime sulfonates, triazides, diazoquinone sulfonates, or sulfonium or iodonium salts of sulfonic acids. Examples of suitable PAGs include, but are not limited to:

Alternatively, acid could be generated by a combination of a PAG and a sensitizer. In such systems, energy of radiation can be absorbed by the sensitizer and transmitted in some manner to the PAG. The transmitted energy causes PAG to decompose and generate photoacid. In such embodiments, any suitable photoacid generator compound can be used. Suitable classes of photoacid generators generating sulfonic acids include, but are not limited to, sulfonium or iodonium salts, oximidosulfonates, bissulfonyldiazomethane compounds, and nitrobenzylsulfonate esters. Suitable photoacid generator compounds are disclosed, for example, in U.S. Pat. Nos. 5,558,978 and 5,468,589, which are incorporated herein by reference. Other suitable photoacid generators are perfluoroalkyl sulfonyl methides and perfluoroalkyl sulfonyl imides, such as those disclosed in U.S. Pat. No. 5,554,664, which is incorporated herein by reference.

Still other suitable examples of photoacid generators include, but are not limited to, triphenylsulfonium bromide, triphenylsulfonium chloride, triphenylsulfonium iodide, triphenylsulfonium hexafluorophosphate, triphenylsulfonium hexafluoroarsenate, triphenylsulfonium hexafluoroarsenate, triphenylsulfonium trifluoromethanesulfonate, diphenylethylsulfonium chloride, phenacyldimethylsulfonium chloride, phenacyltetrahydrothiophenium chloride, 4-nitrophenacyltetrahydrothiopheniumn chloride, and 4-hydroxy-2-methylphenylhexahydrothiopyrylium chloride.

In some embodiments, the amount of the photoactive compound can be at least about 0.0001 weight % (e.g., at least about 0.001 weight %, at least about 0.01 weight %, at least about 0.1 weight %, or at least about 1 weight %) and/or at most about 20 weight % (e.g., at most about 15 weight %, at most about 10 weight %, or at most about 5 weight %) of the entire weight of the photosensitive composition for the second layer.

Suitable solvents useful in photosensitive compositions used to form the first or second layer include alcohols, ketones, lactones, ethers, amides, imides and esters. The solvent typically should dissolve all components of the composition, cast a good film, avoid interfering with any reaction between the components in the composition and avoid dissolving components in the other layer. Suitable examples of organic solvents include, but are not limited to, gamma-butyrolactone (GBL), N-methyl-2-pyrrolidone (NMP), dimethylimidazolidinone, N-methylcaprolactam, N-methylpropionamide, N,N-dimethylacetamide (DMAc), dimethyl sulfoxide (DMSO), N,N-dimethylformamide (DMF), N,N-diethylformamide, diethylacetamide, methyl ethyl ketone (MEK), methyl isobutyl ketone (MIBK), 2-heptanone, cyclopentanone (CP), cyclohexanone, n-butyl acetate (nBA), propylene glycol methyl ether acetate (PGMEA), propylene glycol methyl ether (PGME), ethyl lactate (EL), propyl lactate, 3-methyl-3-methoxybutanol, tetralin, isophorone, ethylene glycol monobutyl ether, diethylene glycol monoethyl ether, diethylene glycol monoethyl ether acetate, diethylene glycol dimethyl ether, diethylene glycol methylethyl ether, triethylene glycol monoethyl ether, dipropylene glycol monomethyl ether, methyl 3-methoxypropionate, ethyl 3-ethoxypropionate, diethyl malonate, ethylene glycol 1,4:3,6-dianhydrosorbitol, 2,5-dimethyl ether (2,5-dimethylisosorbide), 1,4:3,6-dianhydrosorbitol 2,5-diethyl ether (2,5-diethylisosorbide) and mixtures thereof. Preferred organic solvents include n-butyl acetate (nBA), propylene glycol methyl ether acetate (PGMEA), propylene glycol methyl ether (PGME), ethyl lactate (EL), propyl lactate, and 3-methyl-3-methoxybutano. These solvents can be used individually or in combination.

In some embodiments, the first layer can be a photosensitive, dielectric layer prepared from a photosensitive, dielectric composition (e.g., a negative tone composition) that includes: (a) at least one polyimide polymer (e.g., a fully imidized polyimide polymer); (b) at least one solubility switching compound (SSC) (such as those described above), (c) at least one photoactive compound selected from the group consisting of a photosensitive radical initiator and a photosensitizer/initiator combination (such as those described above), and (d) at least one solvent (such as those described above). The SSC in the first layer can be selected from the same SSCs described above in connection with the second layer, and can be the same as, or different from, the SSC in the second layer. In general, a dielectric layer described herein has a dielectric constant of from 2 to 5 when measured at frequencies from 1 kHz to 100 GHz.

In some embodiments, the at least one polyimide polymer present in the first layer has a glass transition temperature (Tg) of at least about 180° C. (e.g., at least about 190° C., at least about 200° C., at least about 210° C., or at least about 220° C.) and/or at most about 300° C. (e.g., at most about 290° C., at most about 280° C., at most about 270° C., at most about 260° C., or at most about 250° C.).

Imidization to form a polyimide can be confirmed by observation of characteristic absorptions in the infrared spectrum from 1770 and 1700 cm$^{-1}$ attributable to the imide ring structure. As used herein, the term "fully imidized" means the polyimide polymers of this disclosure are at least about 90% (e.g., at least about 95%, at least about 98%, at least about 99%, or about 100%) imidized.

The first layer can be formed by using photosensitive polyimide compositions as described in U.S. patent application Publication Nos. 2014/0343199 and 2015/0219990, and U.S. application Ser. Nos. 62/412,363, 62/415,550, 62/416,756, all of which are incorporated herein by reference. In some embodiments, the at least one polyimide present in the first layer is not a polyamic acid nor polyamic ester, but is a pre-imidized polyimide as described in the above mentioned patent applications. In some embodiments, the at least one polyimide present in the first layer is a polyimide containing an indane group in a repeat unit.

In some embodiments, the polyimide polymer that can be used to prepare the first layer contains a reactive group such as a hydroxyl group (—OH), a thiol group (—SH), or a carboxyl group (—COOH).

Other optional additives including, but not limited to, reliability enhancers, adhesion promoters, surfactants, nanoparticles, plasticizers, dyes, and pigments can be added to the photosensitive composition for preparing the first or second layer of this disclosure. The amounts of these additional additives can range from 0 wt % to about 15 wt % based on the entire weight of the photosensitive composition.

Examples of reliability enhancer compound that can improve reliability (e.g., improved chemical and thermal resistance) of the photosensitive composition include, but are not limited to, N-(3-acryloxy-2-hydroxypropyl)-3-aminopropyl trietoxysilane, (acryloxymethyl)phenethyl trimethoxysilane, acryloxymethyl trimethoxysilane, acryloxymethyl triethoxysilane, metacryloxymethyl trimethoxysilane, methacryloxymethyl triethoxysilane, (3-acryloxypropyl) methyldimethoxysilane, (3-acryloxypropyl) trimethoxysilane, (3-acryloxypropyl) triethoxysilane, (3-methacryloxypropyl) trimethoxysilane, (3-methacryloxypropyl) triethoxysilane, (4-acryloxybutyl) trimethoxysilane, (4-acryloxybutyl) triethoxysilane, (4-methacryloxybutyl) trimethoxysilane, (4-methacryloxybutyl) triethoxysilane, (2-acryloxyethyl) trimethoxysilane, (2-acryloxyethyl) triethoxysilane, (2-methacryloxyethyl) trimethoxysilane, (2-methacryloxyethyl) triethoxysilane, (methacryloxymethyl)-methyldiethoxysilane, (methacryloxymethyl)methyldimethoxysilane, 3-methacryloxypropyl bis(trimethylsiloxy)methylsilane, methacryloxypropyl tris (mrthoxyethoxy)silane, allyl trimethoxysilane, 1,3-diallyl tetrakis(trimethylsiloxy)-disiloxane, vinyl trimethoxysilane, vinyl triethoxysilane, and vinyl triisopropoxysilane. Other reliability compounds have been disclosed, for example, in U.S. Provisional Application No. 62/367,806.

Suitable adhesion promoters are described in "Silane Coupling Agent" Edwin P. Plueddemann, 1982 Plenum Press, New York. Classes of adhesion promoters include, but are not limited to, mercaptoalkoxysilanes, aminoalkoxysilanes, epoxyalkoxysilanes, glycidyloxyalkoxysilanes, mercaptosilanes, cyanatosilanes and imidazole silanes. Examples of suitable adhesion promoters include, but are not limited to, gamma-aminopropyltrimethoxysilane, N-phenyl aminopropyl trimethoxysilane, N-methyl aminopropyl trimethoxysilane, (N,N-diethyl-3-aminopropyl) trimethoxysilane, Bis[3-(methylamino)propyl] trimethoxy silane, N'(3-trimethoxysilylpropyl) diethylenetriamine, 3-(1,3 dimethylbuthylidene) aminopropyl trimethoxysilane, gamma-glycidyloxypropylmethyldimethoxysilane, gamma-glycidyloxypropyl-methyldiethoxysilane, glycidyloxypropyltrimethoxysilane, 2-(3,4-epoxycyclohexyl) ethyltriethoxysilane, (3-triethoxysilylpropyl) t-butylcarbamate, triethoxysilylpropyl ethyl carbamate, 3-(triethoxysilyl)propyl succinic anhydride, triethoxysilyl propyl maleamic acid, isocyanato propyl trimethoxysilane, 2-cyanatoethyl trimethoxysilane, N-(3-triethoxysilyl propyl)-4,5-dihydroimidazole), bis[3-(triethoxysilyl)propyl]disulfide, and gamma-mercaptopropyl-methyldimethoxysilane. In some embodiments, a combination of (meth)acrylate-containing reactive functional compound and imidazole-containing adhesion promoter can be included in a negative tone polyimide composition to form dry films with superior reliability and good adhesion to various substrates such as silicon, silicon oxide, metals, plastics, etc.

Examples of suitable surfactants include, but are not limited to, the surfactants described in JP-A-62-36663, JP-A-61-226746, JP-A-61-226745, JP-A-62-170950, JP-A-63-34540, JP-A-7-230165, JP-A-8-62834, JP-A-9-54432 and JP-A-9-5988.

Some embodiments of the disclosure include a process for preparing a photosensitive stacked structure described above. The process can include: (a) coating a substrate with a composition that forms the first layer to form a first coated substrate; (b) baking the first coated substrate in a first baking step to form the first layer; (c) coating the first layer with a composition that forms the second layer to form a second coated substrate; and (d) baking the second coated substrate in a second baking step to form the second layer on top of the first layer.

Some embodiments of the disclosure include a process for preparing a sloped relief image using the photosensitive stacked structure described herein. The process can include: (a) exposing the photosensitive stacked structure to an actinic radiation through a mask to form a pattern-wise exposed stacked structure; (b) optionally, baking, in a third baking step, the pattern-wise exposed photosensitive stacked structure (e.g., such that the exposed portions of the photosensitive stacked structure are crosslinked or cured); (c) developing at least a portion of the pattern-wise exposed photosensitive stacked structure (e.g., by removing at least a portion of the unexposed areas) with a developer to produce a sloped relief image on the stacked structure; (d) optionally, rinsing the relief image with a solvent or a mixture of solvents; and (e) optionally, baking the stacked structure having a slope relief image in a fourth baking step.

Without wishing to be bound by theory, it is believed that the dissolution rate difference in the first and the second layer in a developer can allow formation of a sloped relief image having a wall angle of at most about 80° (e.g., at most about 77°, at most about 75°, at most about 70°, at most about 65°, or at most about 60°) and/or at least about 60° (e.g., at least about 63°, at least about 66°, at least about 70°, or at least about 75°). This is advantageous as certain down-stream processes (e.g., metal deposition) in packaging require relief images having more shallow angle (e.g., at most about 80°). In some embodiments, without wishing to be bound by theory, it is believed that, because the second layer (which is a top layer in the photosensitive stacked structure) has a higher dissolution rate than first layer (which is the lower layer in the photosensitive stacked structure), the second layer dissolves more than the first layer during the development process. This increased dissolution creates a larger opening in the top layer than in the lower layer leading to a more shallow wall angle (e.g., at most about 80°). The differential dissolution characteristics of the two layers creates the desired profile for certain down-stream processes.

In some embodiments, a copper layer is deposited in open areas of the first and second layers after at least a portion of the unexposed photosensitive stacked structure is removed.

In some embodiments, the first and second layers can be formed by any suitable method, including, but not limited to, spin coating, slit coating, spray coating, dip coating and ink-jetting.

In some embodiments, the baking steps can be done using contact or proximity heating on a hotplate at a fixed temperature or by ramping the temperature at a rate of 1-20° C./minute. In some embodiments, the baking steps can be done in an oven at a fixed temperature or by ramping the temperature at a rate of 1-20° C./minute either under vacuum or at atmospheric pressure. Irrespective of the baking method used, the baking steps can be performed in either a single step or multiple steps. Examples of suitable baking means include, but are not limited to, hotplates, infrared lamps, convection ovens, and thermal heating elements on ink jet printing heads.

In some embodiments, the exposure step is completed by using light, or other actinic radiation (e.g., ultraviolet light, visible light, electron beam radiation, or X-rays). The use of i-line (365 nm), h-line (405 nm), or g-line (436 nm) UV light is preferred. In general, the exposure step can result in change in the dissolution rate of exposed areas.

In some embodiments, after exposure of the photosensitive stacked structure containing the second layer at the top of the first layer to light or other actinic radiation through a mask or template, unexposed portions of the first layer and the second layer are removed by using a developer to form a pattern. In some embodiments, examples of developers include an organic solvent or a mixture of organic solvents. Developers are not limited to cyclopentanone. Suitable examples of developers include, but are not limited to, gamma-butyrolactone (GBL), N-methyl-2-pyrrolidone (NMP), dimethylimidazolidinone, N-methylcaprolactam, N-methylpropionamide, N,N-dimethylacetamide (DMAc), dimethyl sulfoxide (DMSO), N,N-dimethylformamide (DMF), N,N-diethylformamide, diethylacetamide, methyl ethyl ketone (MEK), methyl isobutyl ketone (MIBK), 2-heptanone, cyclopentanone (CP), cyclohexanone, n-butyl acetate (nBA), propylene glycol methyl ether acetate (PG-MEA), propylene glycol methyl ether (PGME), ethyl lactate (EL), propyl lactate, 3-methyl-3-methoxybutanol, tetralin, isophorone, ethylene glycol monobutyl ether, diethylene glycol monoethyl ether, diethylene glycol monoethyl ether acetate, diethylene glycol dimethyl ether, diethylene glycol methyl ethyl ether, triethylene glycol monoethyl ether, dipropylene glycol monomethyl ether, methyl 3-methoxypropionate, ethyl 3-ethoxypropionate, diethyl malonate, ethylene glycol and mixtures thereof. Preferred developers are gamma-butyrolactone (GBL), cyclopentanone (CP), cyclohexanone, ethyl lactate (EL), n-butyl acetate (nBA) and dimethylsulfoxide (DMSO). More preferred developers are gamma-butyrolactone (GBL), cyclopentanone (CP) and cyclohexanone. These developers can be used individually or in combination of two or more to optimize the relief image quality for the particular composition and lithographic process. In some embodiments, the developer used to remove the first layer and the second layer is the same. In some embodiments, the developer used to remove the first layer (first developer) is different from the developer used to remove the second layer (second developer). In such cases, the development rate of the second layer in the second developer should be higher than the development rate of the first layer in the first developer.

In some embodiments, the development can be carried out by any suitable method, such as spraying the developer described above on the photosensitive structure, immersing the photosensitive structure in the developer, on track development by puddle, or applying ultrasonic waves to the photosensitive structure while immersing in the developer, spraying the developer while rotating the substrate, or the like. Development times can range from about 20 seconds to about three minutes (e.g., from about 30 seconds to about 2 minutes or from about 45 seconds to about 90 seconds) for each layer. In some embodiments, multiple development steps can be employed for each layer. In some embodiments, two or three development steps can be employed for each layer. In some embodiments, two or three development steps are employed where each development step takes from about 25 seconds to about 45 seconds.

In some embodiments, after the development, an optional rinse treatment can be carried out with an organic rinse solvent. Suitable examples of organic rinse solvents include, but are not limited to, alcohols (such as isopropyl alcohol, methyl isobutyl carbinol (MIBC), propylene glycol monomethyl ether (PGME), and amyl alcohol), esters (such as n-butyl acetate (nBA), ethyl lactate (EL) and propylene glycol monomethyl ether acetate (PGMEA)), ketones (such as cyclopentanone (CP) and cyclohexanone), and mixtures thereof. A rinse solvent can be used to carry out the rinse treatment to remove residues.

In some embodiments, the first baking step and/or the second baking step temperatures are from about 50° C. to about 120° C. (e.g., from about 70° C. to about 120° C. or from about 80° C. to about 120° C.).

In some embodiments, an optional third baking step can be incorporated before developing. In some embodiments, the third baking step temperature is from about 40° C. to about 150° C. (e.g., from about 50° C. to about 120° C. or from about 50° C. to about 110° C.).

In some embodiments, an optional fourth baking step can be incorporated after developing. The fourth baking step can be performed at a temperature lower than the glass transition temperature (Tg) of the first layer, thereby permitting the use of a high Tg material (e.g., a high Tg polyimide) as a dielectric material in an advanced packaging application. In some embodiments, the fourth baking step can be performed at a temperature ranging from at least about 120° C. (e.g., at least about 130° C., at least about 140° C., at least about 150° C., at least about 160° C., at least about 170° C., or at least about 180° C.) to at most about 250° C. (e.g., at most about 240° C., at most about 230° C., at most about 220° C., at most about 210° C., at most about 200° C. or at most about 190° C.). The baking time can be at least about 5 minutes (e.g., at least about 10 minutes, at least about 20 minutes, at least about 30 minutes, at least about 40 minutes, at least about 50 minutes, or at least about 60 minutes) and/or at most about 5 hours (e.g., at most about 4 hours, at most about 3 hours, at most about 2 hours, or at most about 1.5 hours). This baking step can remove residual solvent from the remaining first and second layers and can further cure the remaining first and second layers. Curing can be done in air or preferably, under a blanket of nitrogen and may be carried out by any suitable heating means. In general, the processes described above can produce a sloped relief image (profile) on the structure containing a stack with the second layer at the top of the first layer.

In some embodiments, the thickness of the first or second layer formed on a substrate is preferably from about 0.5 μm to about 200 μm. The appropriate film thickness employed will be determined by the specific application.

Figure 2:
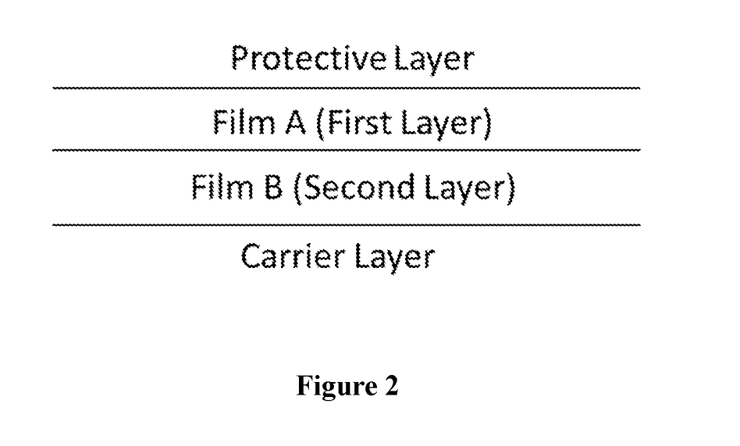
FIG. 2 illustrates an exemplary dry film structure described in this disclosure.

Some embodiments of the disclosure include a dry film structure that includes: a carrier layer; a first layer, the first layer being a photosensitive dielectric layer; a second layer, the second layer being a photosensitive layer and between the carrier layer and the first layer; and optionally, a protective layer, the first layer being between the second layer and the optional protective layer. The ratio of the dissolution rate of the first layer to the dissolution rate of the second layer in a developer (e.g., cyclopentanone) is less than 1 (e.g., less than 0.95, less than 0.9, less than 0.85, less than 0.8, less than 0.75, less than 0.7, less than 0.6, or less than 0.5). An exemplary dry film structure is shown in FIG. 2. As shown in FIG. 2, film A is the first layer, which can be the same as the first layer in the photosensitive stacked structure described above. Film B in FIG. 2 is the second layer, which can be the same as the second layer in the photosensitive stacked structure described above.

Some embodiments of the disclosure include a process that includes: (a) removing the optional protective layer from the dry film structure described above; and (b) applying the structure obtained in step (a) onto an electronic substrate to form a laminate. The process can further include one of more the following steps: (a) exposing the first layer and the second layer in the laminate to actinic radiation; (b) removing the carrier layer before or after exposing the first layer and the second layer; (c) removing unexposed portions in the first layer and the second layer by using a developer; and (d) curing the remaining first and second layers.

Some embodiments of the disclosure include a method for preparation of the dry film structure described above. The method can include: (a) coating a carrier layer with a composition to form the second layer; (b) drying the second layer; (c) coating the second layer with a composition to form the first layer; (d) drying the first layer; and optionally (e) applying a protective layer to the first layer to form the dry film structure.

The compositions for preparing the first and the second layers in the dry film structure can be the same compositions for preparing the first and the second layers in the photosensitive stacked structure as described earlier.

In some embodiments, the carrier layer is a single or multiple layer film, which optionally has undergone treatment to modify the surface of the film that will contact the second layer of the dry film structure. In some embodiments, one or more layers of a multilayer carrier layer can contain particles. Examples of particles include, but are not limited to, inorganic particles such as silicon dioxide particles (aggregated silica and the like), calcium carbonate particles, alumina particles, titanium oxide particles, and barium sulfate particles; organic particles such as crosslinked polystyrene particles, acrylic particles, and imide particles; and their mixtures. Without wishing to be bound by theory, it is believed that the particles can improve the adhesion properties of the carrier layer, and can improve the uniformity of the second layer coated on the carrier layer.

In some embodiments, the carrier layer has excellent optical transparency and is substantially transparent to actinic irradiation used to form a relief pattern in the first layer and the second layer. In some embodiments, the carrier layer can possess low surface roughness. The carrier layer in general should be sufficiently strong and it should be insoluble in the solvent used to form the second layer. The carrier layer can be removed from the remainder of the dry film structure (e.g., the first layer and the second layer) in subsequent use, or can form part of the final structure of the fabricated device. In situations where the carrier layer is eventually removed from the final device, such as by peeling, adhesion between the carrier layer and the second layer should be weak enough to allow for ease of separation. In such embodiments, the carrier layer can include a release layer on the surface to be coated by the second layer to facilitate removal of the carrier layer. In cases in which the carrier layer is part of the final device, adhesion should be high to prevent peeling of the carrier layer.

As specific examples of the carrier layer, there can be various plastic films such as polyethylene terephthalate (PET), polyethylene naphthalate, polypropylene, polyethylene, cellulose tri-acetate, cellulose di-acetate, poly(metha)acrylic acid alkyl ester, poly(metha)acrylic acid ester copolymer, polyvinylchloride, polyvinyl alcohol, polycarbonate, polystyrene, cellophane, polyvinyl chloride copolymer, polyamide, polyimide, vinyl chloride-vinyl acetate copolymer, polytetrafluoroethylene, polytrifluoroethylene, and the like. In addition, a combination material containing two or more plastic films or two or more polymers can be used. Polyethylene terephthalate (PET) film having excellent optical transparency is particularly preferable. The thickness of the carrier layer can be in the range of at least about 10 μm (e.g., at least about 15 μm, at least about 20 μm, at least about 30 μm, at least about 40 μm, at least about 50 μm or at least about 60 μm) to at most about 150 μm (e.g., at most about 140 μm, at most about 120 μm, at most about 100 μm, at most about 90 μm, at most about 80 μm, or at most about 70 μm). The Young's modulus of the carrier layer can be in the range of at least about 100 MPa (e.g., at least about 150 MPa, at least about 200 MPa, or at least about 250 MPa) to at most about 500 MPa (e.g., at most about 450 MPa, at most about 400 MPa, or at most about 350 MPa).

The carrier layer can be used with or without corona treatment. Corona is ionized air created by discharging high frequency high voltage energy across a metal or insulated electrode. This electrode is positioned over a grounded roll. The corona treatment of films can optimize surfaces for adhesion by removing surface contaminants, creating bonding sites and raising the surface energy. In some embodiments, corona treatment can be done during winding of the carrier layer film to form a roll by passing the film through a corona process. This produces pretreated corona film. Such corona treated carrier layer films are commercially available. Another option is "online corona treatment" where the carrier layer film is passed through a corona chamber just before coating of the second layer composition onto the carrier layer. On line corona treatment of carrier layer can improve print quality, eliminates pinholing in coating, and increases dry film structure productivity.

The coating method to form the second layer of the dry film structure is not particularly limited. For example, methods such as spray coating, roll coating, rotation coating, slit coating, compression coating, curtain coating, die coating, wire bar coating, and knife coating can be used to form the second layer. The drying temperature used to form the second layer can vary according to the components, the organic solvent, and the content ratio. In some embodiments, drying is carried out at a temperature of at least about 60° C. (e.g., at least about 65° C., at least about 70° C. or at least about 75° C.) to at most about 120° C. (e.g., at most about 105° C., at most about 90° C. or at most about 85° C.) for at least about 30 seconds (e.g., at least about 1 minute, at least about 2 minutes, at least about 4 minutes or at least about 6 minutes) to at most about 15 minutes (e.g., at most about 12 minutes, at most about 10 minutes, or at most about 8 minutes). An example of the drying means is a convection oven using hot air, but any suitable heating means can be employed.

The thickness of the second layer of the dry film structure of the present disclosure is not particularly limited. The thickness is preferably at least about 2 μm (e.g., at least about 5 μm, at least about 10 μm, at least about 20 μm, at least about 25 μm, at least about 30 μm, at least about 35 μm or at least about 40 μm) and/or at most about 100 μm (e.g., at most about 90 μm, at most about 80 μm, at most about 70 μm, at most about 60 μm, at most about 50 μm or at most about 45 μm). In some embodiments, the second layer can have a relatively small thickness. In such embodiments, the second layer can have a thickness of at most about 10 μm (e.g., at most about 5 μm, at most about 4 μm, or at most about 3 μm).

In some embodiments, melt viscosity and melting point can be important thermal properties of the above described first and second polymeric layers. Both of these properties can be critical for effective lamination of the dry film structure onto a substrate.

In some embodiments, each of the first and second layers in the dry film structure can have a melt viscosity of at least about 10 poise (e.g., at least about 20 poise, at least about 30 poise, at least about 40 poise or at least about 50 poise) and/or at most 150 poise (e.g., at most about 140 poise, at most about 130 poise, at most about 120 poise, at most about 110 poise, at most about 100 poise or at most about 90 poise) at a temperature from about 60° C. to about 140° C. Without wishing to be bound by theory, it is believed that, when melt viscosity of the first or second layer is too low, over-flowing of the first or second layer can occur during lamination. This results in inconsistent film thickness of the laminated film and contamination of the backside of substrate. When the melt viscosity is too high, polymer flow can be unusually slow which results in voids and air-bubbles in the layer thus formed. Moreover, if the carrier layer is patterned, slow polymer flow can cause incomplete and improper filling of the patterns.

In some embodiments, the first or second layer has a melting point of at least about 60° C. (e.g., at least 65° C., at least about 70° C., at least about 75° C., or at least about 80° C.) and/or at most about 140° C. (e.g. at most about 135° C., at most about 130° C., at most about 125° C., or at most about 120° C.). Without wishing to be bound by theory, it is believed that, when the melting point of the first or second layer is too low, formation of a dry film can be hindered to such a degree that the formation of the dry film stack, typically by a continuous process, is hindered. When the melting point is too high, a high temperature is needed during lamination of the first or second layer to the carrier layer and can cause the carrier layer to be melted, thereby ruining the dry film stack. In addition, when a second layer with a high melting point is used in a lower temperature lamination process, the second layer can have poor adhesion with the carrier layer.

In some embodiments, the first layer is coated on top of the second polymeric layer in the dry film structure. The coating method for the first layer can be identical to the coating method for the second layer. The thickness of the first layer of the dry film structure of the present disclosure is not particularly limited. The thickness is preferably at least about 2 μm (e.g., at least about 5 μm, at least about 10 μm, at least about 20 μm, at least about 25 μm, at least about 30 μm, at least about 35 μm or at least about 40 μm) and/or at most about 100 μm (e.g., at most about 90 μm, at most about 80 μm, at most about 70 μm, at most about 60 μm, at most about 50 μm or at most about 45 μm).

In some embodiments, the dry film structure optionally includes a protective layer (e.g., a protective film or a protective cover sheet) so that the first layer is disposed between the protective layer and the second polymeric layer. The protective layer can protect the first and second layers during transit and storage, and keeping the tacky first layer from sticking to itself. In some embodiments, the protective layer is a single or multiple layer film which optionally has undergone treatment to modify the surface of the film that will contact the first layer of the dry film structure. The protective layer can be made from polyethylene, polypropylene, or any other suitable polymer. In some embodiments, adhesion of the protective layer to the first layer is less than that of the first layer to the second layer. This allows for easy separation of the protective layer from the first layer without also separating the first layer from the second layer. The protective layer can be laminated to the first layer by a roll compression method.

In some embodiments, the optional protective layer can have a Young's modulus in the range of at least about 100 MPa (e.g., at least about 150 MPa, at least about 200 MPa, or at least about 250 MPa) to at most about 500 MPa (e.g., at most about 450 MPa, at most about 400 MPa, or at most about 350 MPa).

In general, the dry film structure described herein can be used to laminate the first and second layers to a substrate (e.g., an electronic substrate) to form the photosensitive stacked structure described above. In some embodiments, the first and second layers of the dry film structure can be laminated to any type of substrates (e.g., electronic substrates) using a differential pressure laminator where vacuum, heat, and pressure are combined for voidless lamination. For example, the optional protective layer of the dry film structure can be peeled off, and the remainder of the structure (which includes the first polymeric layer, the second polymeric layer, and the carrier layer) can then be cut to the substrate size. As another example, the dry film structure can first be cut to the substrate size and then the protective layer can be peeled off to laminate the first polymeric layer and the second polymeric layer onto a substrate. In some embodiments, these substrates, pre-laminated either manually or with the assistance of currently available dispensing equipment, are placed on the slide mounted platen or positioned in a chamber. Substrates varying in thickness and geometry can be intermixed to increase throughput. The substrate can then be exposed to a vacuum dwell for a time determined by an integral precision digital timer. Following this period, a preheated silicone rubber diaphragm can descend onto the work piece. This action can close the small gap below the spring-mounted platen assembly and provides direct thermal contact with the lower heat platen. The temperatures of both the upper and lower heated platens can be controlled independently by integral temperature controllers. Differential pressure laminator generally permits the addition of positive pressure above the diaphragm, increasing the effective lamination pressure dramatically. The pressure dwell period can be adjusted with a timer identical to that employed in the vacuum dwell. Upon completion of a cycle, the drawer mechanism can be retracted and the laminated substrate can be removed for further processing.

In some embodiments, the first and the second layers in the dry film structure can be laminated to a substrate through a vacuum lamination at 60° C. to 140° C. after pre-laminating of the first and second layers of the dry film structure with a plane compression method or a hot roll compression method. When the hot roll lamination is employed, the dry film structure can be placed into a hot roll laminator, the protective layer can be peeled away from the first layer/second layer/carrier layer, and the first layer can be brought into contact with and laminated to a substrate using rollers with heat and pressure.

In some embodiments, the lamination temperature used in the lamination process described above is at least about 50° C. (e.g., at least about 70° C., at least about 80° C., at least about 90° C., or at least about 100° C.) to at most about 220° C. (e.g., at most about 190° C., at most about 170° C., at most about 130° C., or at most about 110° C.). The pressure used in the lamination process described above is at least about 1.5 psi (e.g., at least about 3 psi, at least about 5 psi, at least about 10 psi, at least about 15 psi, or at least about 20 psi) to at most about 70 psi (e.g., at most about 60 psi, at most about 50 psi, at most about 40 psi, or at most about 30 psi). The vacuum used in the lamination process described above can be at least about 0.2 torr to at most about 5 torr. The speed of the roller used in the lamination process described above can be at least about 1 cm/min (e.g., at least about 5 cm/min, at least about 10 cm/min, at least about 25 cm/min, or at least about 50 cm/min) to at most about 600 cm/min (e.g., at most about 500 cm/min, at most about 400 cm/min, at most about 300 cm/min at most about 200 cm/min, or at most about 100 cm/min).

In some embodiments, the photosensitive stacked structure can be made from the dry film structure described above. For example, the photosensitive stacked structure can be made by (a) removing the optional protective layer; and (b) laminating the remainder of the film structure to a substrate (e.g., an electronic substrate). The photosensitive stacked structure thus formed includes the first layer and the second layer laminated to the substrate and can be exposed through a desired patterned photomask such that the exposed areas in the first and the second layer are crosslinked. Examples of active energy beams used for exposure include electron beams, ultraviolet light and X-ray, with ultraviolet light being preferable. As a light source, it is possible to use a low-pressure mercury lamp, a high-pressure mercury lamp, an extra-high-pressure mercury lamp, a halogen lamp, etc. The exposure dose is typically from about 100 mJ/cm$^2$ to about 1,000 mJ/cm$^2$.

The carrier layer can be removed by peeling before or after the exposure.

After the exposure, the first and second layers of the laminated structure can be heat treated from at least about 50° C. (e.g., at least about 55° C., at least about 60° C., or at least about 65° C.) to at most about 100° C. (e.g., at most about 95° C., or at most about 90° C., at most about 85° C., at most about 80° C., at most about 75° C., or at most about 70° C.) for at least about 60 seconds (e.g., at least about 65 seconds, or at least about 70 seconds) to at most about 90 seconds (e.g., at most about 85 minutes, or at most about 80 seconds). The heat treatment is usually accomplished by use of a hot plate or oven.

After the exposure, the first and second layers of the laminated structure can be developed to remove unexposed portions by using a developer. Development can be carried out by using the same methods described above (e.g., an immersion or spraying method). Microholes and fine lines can be generated in the photosensitive first polymeric layer on the laminated substrate after development.

Examples of developers suitable for developing the first and second layers can be the same developers listed previously.

In some embodiments, after the development, an optional rinse treatment can be carried out with an organic rinse solvent. Suitable examples of organic rinse solvents can be the same as mentioned earlier.

In some embodiments, after the development step or the optional rinse treatment step, an optional baking step can be carried out. at a temperature ranging from at least about 120° C. (e.g., at least about 130° C., at least about 140° C., at least about 150° C., at least about 160° C., at least about 170° C., or at least about 180° C.) to at most about 250° C. (e.g., at most about 240° C., at most about 230° C., at most about 220° C., at most about 210° C., at most about 200° C. or at most about 190° C.). The baking time is at least about 5 minutes (e.g., at least about 10 minutes, at least about 20 minutes, at least about 30 minutes, at least about 40 minutes, at least about 50 minutes, or at least about 60 minutes) and/or at most about 5 hours (e.g., at most about 4 hours, at most about 3 hours, at most about 2 hours, or at most about 1.5 hours). This baking step can remove residual solvent from the remaining first and second layers and can further cure the remaining first and second layers. Curing can be done in air or preferably, under a blanket of nitrogen and may be carried out by any suitable heating means. In general, the processes described above can produce a sloped relief image (profile) on the structure containing a stack with the second layer at the top of the first layer. The structure thus formed can be used to form an article to be used in a semiconductor device. Examples of such articles include a semiconductor substrate, a flexible film for electronics, a wire isolation, a wire coating, a wire enamel, or an inked substrate. Examples of semiconductor devices that can be made from such articles include an integrated circuit, a light emitting diode, a solar cell, and a transistor.

In some embodiments, the disclosure features a process for preparing a photosensitive stacked structure described herein. The process can include:
    (a) coating a substrate with a composition that forms the first layer to form a first coated substrate;
    (b) baking the first coated substrate in a first baking step to form the first layer;
    (c) laminating the first layer with a dry film structure comprising a carrier layer and a second layer to form a second coated substrate, in which the second layer is disposed between the first layer and the carrier layer; and
    (d) removing the carrier layer after laminating the first layer.

In some embodiments, the disclosure features a process for preparing a photosensitive stacked structure described herein. The process can include:
    (a) laminating a substrate with a dry film structure including a carrier layer and a polymeric layer to form a first coated substrate, in which the polymeric layer forms the first layer and the first layer is disposed between the substrate and the carrier layer;
    (b) removing the carrier layer after the laminating step;
    (c) coating the first layer with a composition that forms a second layer to form a second coated substrate; and
    (d) baking the second coated substrate in a baking step to form the second layer such that the first layer is disposed between the second layer and the substrate.

The dry film structure including a carrier layer and a first layer or a second layer can be prepared in the same way as the preparation of a dry film structure containing both the first and second layers described above. Preparation of such dry film structures also described in U.S. Application Publication No. 20160313641, which is incorporated herein by reference.

In some embodiments, the disclosure features a process for preparing a photosensitive stacked structure described herein. The process can include:
    (a) laminating a substrate with a dry film structure including a first carrier layer and a first layer to form a first coated substrate, in which the first layer is disposed between the substrate and the first carrier layer;
    (b) removing the carrier layer after the laminating step;
    (c) laminating the first layer with a dry film structure including a second carrier layer and a second layer to form a second coated substrate, in which the second layer is disposed between the first layer and the second carrier layer; and (d) removing the second carrier layer after laminating the first layer.

One advantage of using individual dry film structures for each of the first and second layers is that if a solvent used to form one of the two layers is incompatible with the other layer, this method minimizes the adverse effect of this solvent because the dry film structures generally have low amount of solvent.

In some embodiments, this disclosure features a three dimensional object containing at least one patterned film formed by a process described herein. In some embodiments, the three dimensional object can include patterned films in at least two stacks (e.g., at least three stacks), each containing a photosensitive stack described herein. In some embodiments, the three dimensional object can be used to make a package of semiconductor devices.

While the term "bilayer structure" has been employed throughout the present disclosure, it should be understood that the present disclosure is not limited to structures having only two layers (i.e. bilayer), but includes any stacked structure containing at least two layers (i.e. three layers, four layers, etc.).

The contents of all publications cited herein (e.g., patents, patent application publications, and articles) are hereby incorporated by reference in their entirety.

The following examples are provided to illustrate the principles and practice of the present disclosure more clearly. It should be understood that the present disclosure is not limited to the examples described.

EXAMPLES

Synthesis Example 1 P-1

Preparation of 6FDA/DAPI Polyimide with water. The amounts of organic solvents (ethyl acetate and acetone) and water used in all of the washes are shown in Table 1.

TABLE 1

|  | Wash 1 | Wash 2 | Wash 3 |
|---|---|---|---|
| Ethyl Acetate (kg) | 22.4 | 4.5 | 4.5 |
| Acetone (kg) | — | 2.5 | 2.5 |
| Water (kg) | 24.0 | 28.4 | 28.4 |

GBL (11 kg) was added to the washed organic phase and the solution was concentrated by vacuum distillation to give a polymer solution P-1. The solid % of final polymer solution was 29.62%, the Tg of the polymer measured by TMA was 293° C., and the weight average molecular weight (Mw) of the polymer measured by GPC was 55,000 Daltons.

To measure the molecular weight by GPC, 200 mg of the above polymer solution was first dissolved in 3.2 g of tetrahydrofuran (THF) that included BHT. The instrument used was a Waters Gel Permeation Chromatograph and the software was Waters Empower 2 Chromatographic software (GPC module). The standard used was five polystyrene standards and one p-cresol dimer standard. Their Mw values were as follows: 198400, 89300, 19100, 4000, and 1200 and 228 (p-cresol dimer). The column used was a Phenomenex Guard column: Phenogel-10, 7.8 mm ID×50 mm length and the flow rate was one milliliter per minute at 35° C.

Synthesis Example 2P-2

Preparation of IBMA/HEMA Polymer

Isobornyl methacrylate (IBMA) (48 g, 215.9 mmol) and hydroxyethyl methacrylate (HEMA) (12 g, 92.2 mmol) were Solid 4,4'-(hexafluoroisopropylidene)bis(phthalic anhydride) (6FDA) (2.170 kg, 4.885 mole) was charged to a solution of 1-(4-aminophenyl)-1,3,3-trimethylindan-5-amine (also known as 4,4'-1,4-[phenylene-bis(1-methylethylidene)]bisaniline (DAPI)) (1.331 kg, 5.00 mole) in NMP (11.724 kg) at 25° C. The reaction temperature was increased to 40° C. and allowed to react for 6 hours. Next, acetic anhydride (1.020 kg) and pyridine (0.198 kg) were added and the reaction temperature was increased to 100° C. and allowed to react for 14 hours.

The reaction mixture above was cooled to room temperature and transferred to a larger vessel equipped with a mechanical stirrer. The reaction solution was diluted with ethyl acetate and washed with water for one hour. After the stirring was stopped, the mixture was allowed to stand undisturbed. Once phase separation had occurred, the aqueous phase was removed. The organic phase was diluted with a combination of ethyl acetate and acetone and washed twice added to 111.4 g of propylene glycol methyl ether acetate (PGMEA) in a 250 mL, 3-neck round bottom flask. To this mixture was added 1.2 g of azobisisobutyronitrile (AIBN). The reaction mixture was then degassed and kept under $N_2$ blanket for duration of the reaction. The reaction mixture was then heated to 70° C. and was kept at this temperature for 4 hours. The polymer solution was then allowed to reach to room temperature. This provided a polymer solution in PGMEA with solid % of 34.76%.

Formulation Example 1 FE-1

A photosensitive composition FE-1 was prepared by using 80 g of polymer solution (P-1), 14.69 g GBL, 1.42 g of a 0.5 wt % solution of PolyFox 6320 (available from OMNOVA Solutions) in GBL, 0.71 g of gamma-glycidoxypropyltrimethoxysilane, 0.71 g of NCI-831 (trade name, available from ADEKA corporation), 0.05 g para-benzoquinone, 8.00 g of tetra(ethylene glycol)diacrylate, and 2.67 g of penta erythritol triacrylate. After being stirred mechanically for 24 hours, the solution was filtered by using a 0.2 micron filter.

Formulation Example 2 FE-2

A photosensitive composition FE-2 was prepared by using 22.86 g of polymer solution (P-2), 7.41 g propylene glycol methyl ether acetate (PGMEA), 0.48 g of a 0.5 wt % solution of PolyFox 6320 (available from OMNOVA Solutions) in GBL, 0.24 g of gamma-glycidoxypropyltrimethoxysilane, 0.24 g of NCI-831 (trade name, available from ADEKA corporation), 0.02 g para-benzoquinone, 2.36 g of tetra(ethylene glycol) diacrylate, and 0.88 g pentaerythritol triacrylate. After being stirred mechanically for 24 hours, the solution was filtered by using a 5-micron syringe filter.

General Procedure for Dissolution Rare Measurement

A photosensitive composition was spin coated on 4 silicon wafers to form coatings with a thickness of about 15 microns. The coated wafers were baked at 95° C. for 180 seconds using a hot plate. The wafers were developed by using cyclopentanone for 15, 25, 35 and 65 seconds (one wafer for each development time). 15 milliliters of developer was stream dispensed onto the wafer in 10 seconds to completely cover the film, formed a puddle of the developer over it, and started puddle development at 25° C. (15, 25, 35 and 65 seconds; the development time listed was the time after the stream dispense stopped). During the dispensing and development steps, the wafer was rotated at a spin speed of 100 RPM. The puddle of developer was removed and the remaining film was dried by spinning for 15 seconds at a spin speed of 3000 RPM. The film thickness loss of each wafer was measured and a graph of thickness loss versus time of development was plotted. The film thickness was measured using a Dektak IIA Profilometer. The data was fitted to a linear function to determine the slope of the line which determined a representative dissolution rate.

Dissolution Rate Measurements

The dissolution rate of photosensitive compositions FE-1 and FE-2 measured according to the General Procedure for Dissolution Rate Measurement were 0.18 and 0.70 microns/second, respectively.

Process Example 1

The photosensitive composition FE-1 was spin coated on a silicon wafer and baked at 95° C. for 180 seconds using a hot plate to form a coating with a thickness of about 15 microns. The photosensitive composition FE-2 was spin coated on the top of the first layer and baked again at 95° C. for 180 seconds using a hot plate to form a second coating with a thickness of about 5 microns. Since the solvent for FE-2 was PGMEA, the two layers were immiscible. The photosensitive bilayer film was exposed with a broadband UV exposure tool (Carl Süss MA-56) through a mask having a desired pattern for exposure. After the exposure, the exposed film was heated at 50° C. for 3 minutes.

After the post exposure bake, unexposed portions were removed by using cyclopentanone as a developer (2×99 seconds of development). A desirable sloped profile with an angle of about 80° and with a resolution of 15 microns at a photospeed of 250 mJ/cm$^2$ was achieved.

Synthesis Example 3 P-3

Polymer (P-3) was synthesized in the same way as polymer (P-1) except that the ratio of 6FDA/DAPI was changed from 0.977 to 0.972 and the amount of the total solid in the reaction mixture was reduced from 28% to 23%. The solvent swap for this polymer solution was cyclopentanone instead of gamma-butyrolactone (GBL). The final weight average molecular weight was 46,500 Daltons and the solid % of the polymer/cyclopentanone solution was 30.14%.

Formulation Example 3 FE-3

A photosensitive composition FE-3 was prepared by using 4375.60 g of polymer solution (P-3), 1061.53 g cyclopentanone, 79.14 g of a 0.5 wt % solution of PolyFox 6320 (available from OMNOVA Solutions) in cyclopentanone, 65.95 g of methacryloxypropyl trimethoxysilane, 39.57 g of NCI-831 (trade name, available from ADEKA corporation), 2.64 g para-benzoquinone, 4445.10 g of tetraethyleneglycol diacrylate, and 148.36 g pentaerythritol triacrylate. After being stirred mechanically for 24 hours, the solution was filtered by using a 2.5 inch, 0.2 µm Ultradyne capsule filter (cat # CSTM0.2-662 from Meissner Filtration Product, Inc.).

Dry Film Example 1 DF-1

Formulation Example 2 (FE-2) was roll-coated into polyethylene terephthalate (PET) carrier layer in the size of 15 cm×30 cm by using a number 9 rod. This was then dried for 10 minutes at 90° C. and a dry film of FE-2 at a film thickness of 5.5 microns was obtained. Formulation Example 3 (FE-3) was then roll-coated at the top of this dry film by using a number 12 rod. This was also dried for 10 minutes at 90° C. to obtain a bilayer dry film of (DF-1) at total film thickness of 13.5 microns (film thickness of the layer formed by FE-3 was 8 microns).

Lamination of Dry Film Example L-1

The dry film DF-1 was placed on a 4-inch Wafernet copper coated wafer. The layer containing FE-3 in the dry film was laminated onto the Cu coated wafer by vacuum lamination (0.2-0.4 Torr) for 20 seconds followed by being subjected to both a pressure of 40 psi and vacuum of 0.2-0.4 Torr for 180 seconds. The lamination temperature was 70° C. Lamination process was done by using a DPL-24A Differential Pressure Laminator manufactured by OPTEK, N.J.

Process Example 2

The PET layer of laminated bilayer dry film obtained from Example L-1 was removed and film was exposed with a broadband UV exposure tool (Carl Süss MA-56) through a mask having a desired pattern for exposure. After the exposure, the exposed film was heated at 50° C. for 3 minutes.

After the post exposure bake, unexposed portions were removed by using cyclopentanone as a developer (2×99 seconds of development). A desirable sloped profile with an angle of about 73° was achieved.

Dry Film Example 2 DF-2

Step 1: The filtered photosensitive solution (FE-3) was applied using reverse microbar coater from Fujifilm USA (Greenwood, S.C.) with line speed of 2 feet/minutes (60 cm per minutes) with 60 um microbar clearance onto a polyethylene terephthalate (PET) film (TA 30, manufactured by Toray Plastics America, Inc.) having a width of 16.2" and thickness of 35 μm used as a first carrier layer and dried at 197° F. to obtain a photosensitive dielectric layer with a thickness of approximately 10.0 microns.

Step 2:The above dry film was placed on a 4 inch Wafernet copper coated wafer. The photosensitive layer in the dry film was laminated onto the Cu coated wafer by vacuum lamination (0.2-0.4 Torr) for 20 seconds followed by being subjected to both a pressure of 40 psi and vacuum of 0.2-0.4 Torr for 180 seconds. The lamination temperature was 70° C. The photosensitive layer was disposed between copper coated wafer and the first carrier layer.

Step 3: Formulation Example 2 (FE-2) was roll-coated onto polyethylene terephthalate (PET) carrier layer (i.e., the second carrier layer) in the size of 15 cm×30 cm by using a number 9 rod. This was then dried for 10 minutes at 90° C. and a dry film of FE-2 at a film thickness of 5.5 microns was obtained.

Step 4: The first carrier layer in the laminated film obtained in step 2 was removed and the dry film that was obtained in step 3 was placed at the top of it by vacuum lamination for 20 seconds followed by being subjected to both a pressure of 40 psi and vacuum of 0.2-0.4 Torr for 180 seconds. The lamination temperature was 70° C. The resulting laminated stack structure contained the copper coated wafer, the photosensitive dielectric layer FE-3, the photosensitive layer FE-2, and the second carrier layer stacked in that order, where the photosensitive dielectric layer FE-3 was disposed between the copper coated wafer and photosensitive layer FE-2.

Comparative Dry Film Example 1 CDF-1

Step 1: The filtered photosensitive solution (FE-3) was applied using reverse microbar coater from Fujifilm USA (Greenwood, S.C.) with line speed of 2 feet/minutes (60 cm per minutes) with 90 μm microbar clearance onto a polyethylene terephthalate (PET) film (TA 30, manufactured by Toray Plastics America, Inc.) having a width of 16.2" and thickness of 35 μm used as a carrier layer and dried at 197° F. to obtain a photosensitive polymeric layer with a thickness of approximately 15.0 microns.

Step 2: The above dry film was placed on a glass substrate sputtered with copper. The polymeric layer was laminated onto the Cu coated substrate by vacuum lamination (0.2-0.4 Torr) for 20 seconds followed by being subjected to both a pressure of 40 psi and vacuum of 0.2-0.4 Torr for 180 seconds. The lamination temperature was 80° C. The resulting laminated stack structure contained the copper coated glass substrate, the photosensitive dielectric layer FE-3, and the PET carrier layer stacked in that order, but did not contain a second photosensitive layer.

Comparative Process Example 1

The PET layer of laminated dry film CDF-1 was removed and the remaining dry film was exposed with a broadband UV exposure tool through a mask having a desired pattern for exposure. Unexposed portions were removed by using cyclopentanone as a developer (2×160 seconds of development). A profile with an angle of about 88° was obtained. Such a profile is nearly rectangular in shape and is undesirable for certain down-stream processes (such as metal deposition).

What is claimed is:

1. A photosensitive stacked structure, comprising:
   an electronic substrate;
   a first layer, the first layer being a photosensitive, dielectric layer formed from a photosensitive composition comprising: (a) at least one polyimide polymer; (b) at least one solubility switching compound (SSC), (c) at least one compound selected from the group consisting of a photosensitive radical initiator and a photosensitizer/initiator combination; and
   a second layer, the second layer being a photosensitive layer;
   wherein the first layer is between the electronic substrate and the second layer, and the dissolution rate of the first layer in a developer is less than the dissolution rate of the second layer in the developer.

2. The structure of claim 1, wherein the second layer comprises: (a) at least one polymer; (b) at least one solubility switching compound (SSC), and (c) at least one photoactive compound selected from the group consisting of a photoacid generator (PAG), a photosensitive radical initiator and a photosensitizer/initiator combination.

3. The structure of claim 2, wherein the second layer is formed from a photosensitive composition comprising: (a) at least one polymer; (b) at least one solubility switching compound (SSC), (c) at least one photoactive compound selected from the group consisting of a photoacid generator (PAG), a photosensitive radical initiator and a photosensitizer/initiator combination, and (d) at least one solvent.

4. The structure of claim 3, wherein the at least one polymer comprises a reactive group.

5. The structure of claim 4, wherein the reactive group is selected from a group consisting of hydroxyl, thiol, amino, and carboxyl groups.

6. The structure of claim 2, wherein the at least one polymer is formed from at least one monomer selected from the group consisting of (meth)acrylates, urethanes, amides, imides, esters, ethers, ethylenically unsaturated hydrocarbons, and a combination thereof.

7. The structure of claim 2, wherein the solubility switching compounds is selected from the group consisting of 1,6-hexanediol di(meth)acrylate, tetraethyleneglycol di(meth)acrylate, divinylbenzene, ethoxylated bisphenol-A-di (meth)acrylate, diethylene glycol bis(allyl carbonate), trimethylolpropane tri(meth)acrylate, ditrimethylolpropane tetra (meth)acrylate, pentaerythritol tri(meth)acrylate, pentaerythritol tetra(meth)acrylate, dipentaerythritol penta-/hexa-(meth)acrylate, isocyanurate tri(meth)acrylate, bis(2-hydroxyethyl)-isocyanurate di(meth)acrylate, 1,3-butanediol di(meth)acrylate, 1,4-butanediol di(meth)acrylate, methyl(meth)acrylate, butyl (meth)acrylate, cyclohexyl (meth)acrylate, benzyl(meth)acrylate, neopentyl glycol di(meth)acrylate, (meth)acrylate modified-urea-formaldehyde resins, (meth)acrylate modified melamine-formaldehyde resins and (meth)acrylate modified cellulose.

8. The structure of claim 1, wherein the polyimide polymer has a glass transition temperature of at least about 180° C.

9. The structure of claim 1, wherein the electronic substrate is a silicon substrate, a copper substrate, an aluminum substrate, a titanium substrate, a substrate having a copper seed layer, a silicon oxide substrate, a silicon nitride substrate, a titanium nitrite substrate, a glass substrate, an organic laminate substrate, or a dielectric material substrate.

10. The structure of claim 1, wherein the electronic substrate is a wafer.

11. A process for preparing the structure of claim 1, comprising:
    (a) coating the substrate with a composition that forms the first layer to form a first coated substrate;
    (b) baking the first coated substrate in a first baking step to form the first layer;
    (c) coating the first layer with a composition that forms the second layer to form a second coated substrate; and
    (d) baking the second coated substrate in a second baking step to form the second layer on top of the first layer.

12. A process for preparing the structure of claim 1, comprising:
    (a) coating the substrate with a composition that forms the first layer to form a first coated substrate;
    (b) baking the first coated substrate in a first baking step to form the first layer;
    (c) laminating the first layer with a dry film structure comprising a carrier layer and the second layer to form a second coated substrate, in which the second layer is between the first layer and the carrier layer; and
    (d) removing the carrier layer after laminating the first layer.

13. A process for preparing the structure of claim 1, comprising:
    (a) laminating the substrate with a dry film structure comprising of a carrier layer and a polymeric layer to form a first coated substrate, in which the polymeric layer forms the first layer and the first layer is disposed between the substrate and the carrier layer;
    (b) removing the carrier layer after the laminating step;
    (c) coating the first layer with a composition that forms the second layer to form a second coated substrate; and
    (d) baking the second coated substrate in a baking step to form the second layer such that the first layer is disposed between the second layer and the substrate.

14. A process for preparing the structure of claim 1, comprising:
    (a) laminating the substrate with a dry film structure comprising a first carrier layer and the first layer to form a first coated substrate, in which the first layer is disposed between the substrate and the first carrier layer;
    (b) removing the first carrier layer after the laminating step;
    (c) laminating the first layer with a dry film structure comprising a second carrier layer and the second layer to form a second coated substrate, in which the second layer is disposed between the first layer and the second carrier layer; and
    (d) removing the second carrier layer after laminating the first layer.

15. A process for preparing a sloped relief image, comprising:
    (a) exposing the photosensitive stacked structure of claim 1 to an actinic radiation through a mask to form a pattern-wise exposed stacked structure;
    (b) optionally, baking, in a third baking step, the pattern-wise exposed photosensitive stacked structure;
    (c) developing at least a portion of the pattern-wise exposed photosensitive stacked structure with a developer to produce a sloped relief image on the stacked structure;
    (d) optionally, rinsing the relief image with a solvent or a mixture of solvents; and
    (e) optionally, baking the stacked structure having a slope relief image in a fourth baking step.

16. The process of claim 15, further comprising the fourth baking step.

17. The process of claim 16, wherein the fourth baking step is performed at a temperature lower than the glass transition temperature of the first layer.

18. A dry film structure, comprising:
    a polymeric carrier layer;
    a first layer, the first layer being a photosensitive dielectric layer formed from a photosensitive composition comprising: (a) at least one polyimide polymer; (b) at least one solubility switching compound (SSC), (c) at least one compound selected from the group consisting of a photosensitive radical initiator and a photosensitizer/initiator combination;
    a second layer, the second layer being a photosensitive layer and disposed between the carrier layer and the first layer; and
    optionally a protective layer, the first layer being disposed between the second layer and the optional protective layer;
    wherein the ratio of the dissolution rate of the first layer to the dissolution rate of the second layer in a developer is less than 1.

19. A process, comprising:
    (a) removing the optional protective layer from the dry film structure of claim 18; and
    (b) applying the structure obtained in step (a) onto an electronic substrate to form a laminate.

20. The process of claim 19, further comprising exposing the first layer and the second layer in the laminate to actinic radiation.

21. The process of claim 20, further comprising removing the carrier layer before or after exposing the first layer and the second layer.

22. The process of claim 21, further comprising removing unexposed portions in the first layer and the second layer by using a developer.

23. The process of claim 22, further comprising curing the remaining first and second layers.

24. A method for preparation of the dry film of claim 18, comprising:
    (a) coating a carrier layer with a composition to form the second layer;
    (b) drying the second layer;
    (c) coating the second layer with a composition to form the first layer;
    (d) drying the first layer; and
    (e) optionally, applying a protective layer to the first layer to form the dry film structure.

* * * * *